(12) United States Patent
Ouyang et al.

(10) Patent No.: US 11,226,528 B2
(45) Date of Patent: Jan. 18, 2022

(54) ARRAY SUBSTRATE FOR REDUCING PARASITIC CAPACITANCE BETWEEN ADJACENT WIRES, DISPLAY PANEL, AND DISPLAY DEVICE

(71) Applicant: HON HAI PRECISION INDUSTRY CO., LTD., New Taipei (TW)

(72) Inventors: Shiang-Ruei Ouyang, New Taipei (TW); Wei-Cheng Chen, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/857,979

(22) Filed: Apr. 24, 2020

(65) Prior Publication Data

US 2021/0215983 A1 Jul. 15, 2021

(30) Foreign Application Priority Data

Jan. 11, 2020 (CN) .......................... 202010028531.7

(51) Int. Cl.
*G02F 1/1333* (2006.01)
*G02F 1/1362* (2006.01)
(Continued)

(52) U.S. Cl.
CPC ....... *G02F 1/136286* (2013.01); *G03B 30/00* (2021.01); *G06F 1/1637* (2013.01); *G06F 1/1686* (2013.01); *H01L 23/5222* (2013.01); *H01L 27/124* (2013.01); *H01L 27/1255* (2013.01); *G02F 1/13606* (2021.01); *G02F 1/133388* (2021.01); *G02F 1/133514* (2013.01); *G02F 1/133602* (2013.01); *G02F 1/136213* (2013.01); *H01L 27/1244* (2013.01)

(58) Field of Classification Search
CPC ......... G02F 1/136286; G02F 1/136213; G02F 1/13606; G02F 1/133388; H01L 27/124; H01L 27/1244; H01L 27/1255; H01L 23/5222; G06F 1/1686; G06F 1/1637
See application file for complete search history.

(56) References Cited

U.S. PATENT DOCUMENTS

| 10,599,190 | B2 * | 3/2020 | Nakamura | ............ H04N 5/2254 |
| 2019/0392767 | A1 * | 12/2019 | Kim | .................. G02F 1/136286 |
| 2020/0090584 | A1 | 3/2020 | Kim et al. | |

FOREIGN PATENT DOCUMENTS

| CN | 107134473 A | 9/2017 |
| WO | 2018/196149 A1 | 11/2018 |

* cited by examiner

Primary Examiner — Paisley L Wilson
(74) Attorney, Agent, or Firm — ScienBiziP, P.C.

(57) ABSTRACT

An array substrate carrying a display area and a camera area surrounded by the display area provides connections to both areas free of electrical interference. The camera area includes a transparent area and a routing area surrounding the transparent area. The array substrate includes a first conductive layer and a second conductive layer. The first conductive layer includes first wires and first capacitance compensation patterns. The second conductive layer includes second wires. Each first capacitance compensation pattern is between adjacent first wires. Along a thickness direction of the array substrate, a projection of each first capacitance compensation pattern on the substrate overlaps with a projection of at least one second wire. A display panel and a display device are also disclosed.

17 Claims, 10 Drawing Sheets

(51) Int. Cl.
  *G03B 30/00*   (2021.01)
  *G06F 1/16*   (2006.01)
  *H01L 23/522*   (2006.01)
  *H01L 27/12*   (2006.01)
  *G02F 1/136*   (2006.01)
  *G02F 1/1335*   (2006.01)
  *G02F 1/13357*   (2006.01)

ARRAY SUBSTRATE FOR REDUCING PARASITIC CAPACITANCE BETWEEN ADJACENT WIRES, DISPLAY PANEL, AND DISPLAY DEVICE

FIELD

The subject matter herein generally relates to displays, in particular, to an array substrate, a display panel using the array substrate, and a display device using the display panel.

BACKGROUND

Display devices such as mobile phones, tablets, and the like, have diverse functions, and often need to combine components for functions to be available. Display devices incorporating a camera are widely produced and used.

Taking an array substrate including a plurality of wires in a display device as an example, the array substrate needs to be provided with a camera area for the camera to function. However, the camera area affects arrangement of the wires of the array substrate and even the performance of the display device.

Therefore, there is room for improvement in the art.

BRIEF DESCRIPTION OF THE DRAWINGS

Implementations of the present disclosure will now be described, by way of embodiment, with reference to the attached figures.

DETAILED DESCRIPTION

Figure 1:
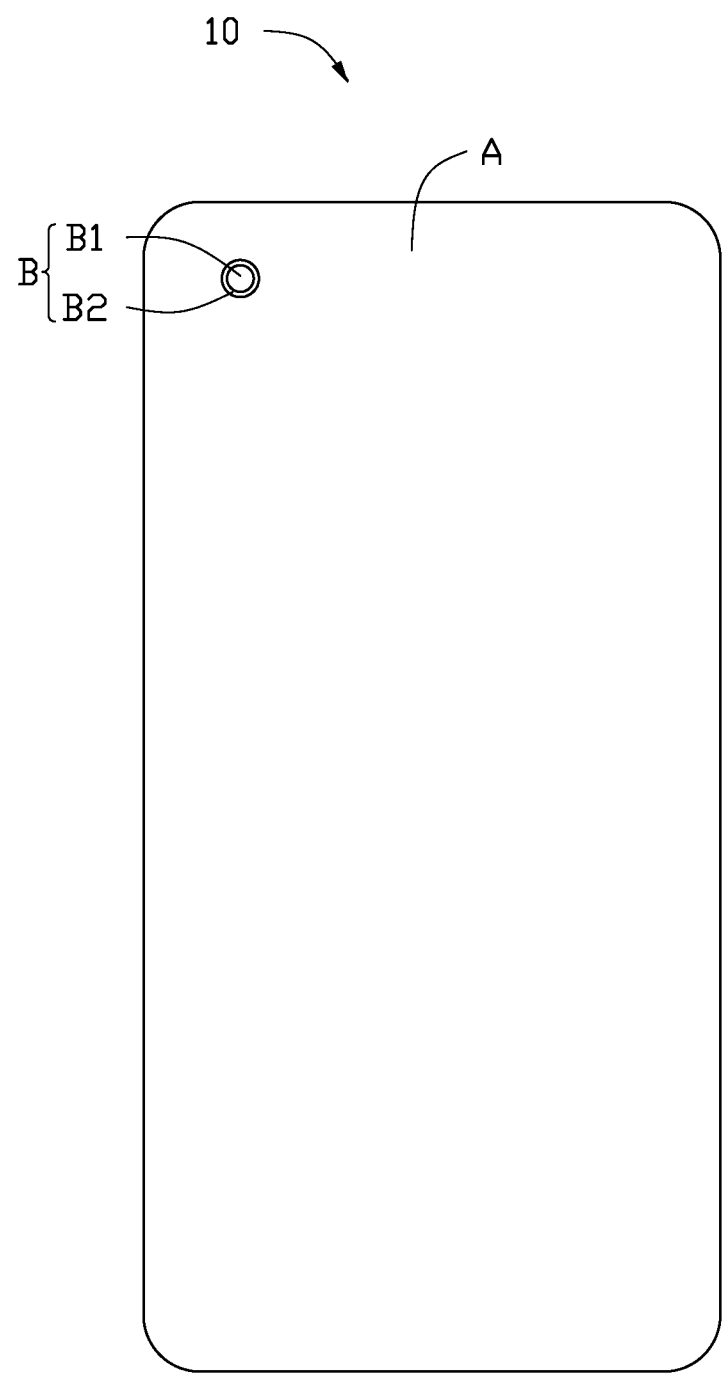
FIG. 1 is a top planar view of an array substrate according to an embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one". The term "circuit" is defined as an integrated circuit (IC) with a plurality of electric elements, such as capacitors, resistors, amplifiers, and the like.

FIG. 1 shows an array substrate 10 according to an embodiment. The array substrate 10 defines a display area A and a camera area B surrounded by the display area A. The camera area B defines a transparent area B1 and a routing area B2 surrounding the transparent area B1. The camera area B is transparent and allows light to pass through. In one embodiment, both the camera area B and the transparent area B1 are substantially circular, the routing area B2 is annular.

In other embodiments, the camera area B may have other shapes. For example, oval, polygonal, and the like.

Figure 2:
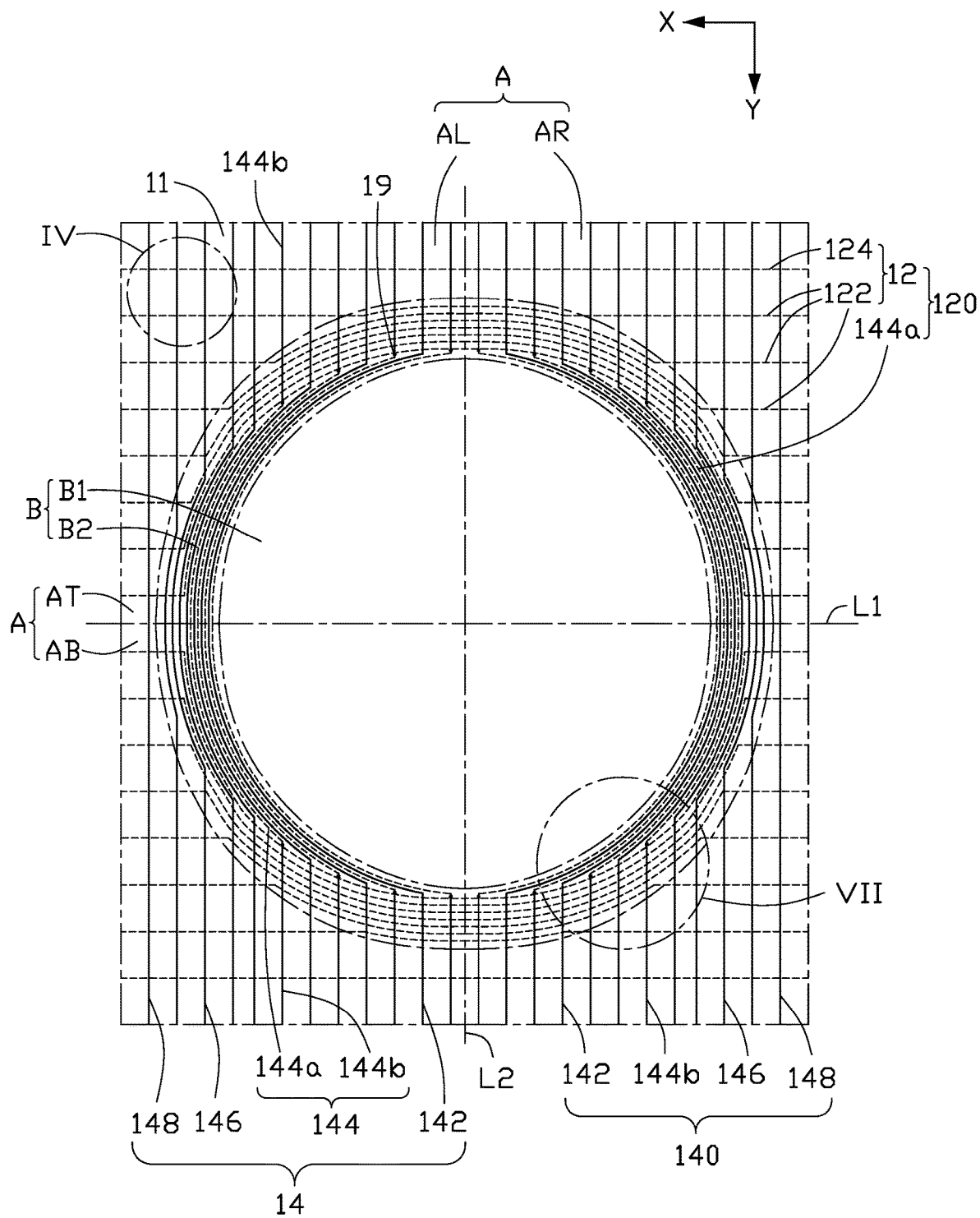
FIG. 2 is a schematic view showing an arrangement of wires of the array substrate of FIG. 1.

As shown in FIG. 2, the routing area B2 has a first axis of symmetry L1 and a second axis of symmetry L2. The routing area B2 is axially symmetrical with respect to the second symmetry axis L2 along a first direction X. The routing area B2 is axially symmetrical with respect to the first symmetry axis L1 along a second direction Y. The second direction Y intersects with the first direction X.

As shown in FIG. 2, in the first direction X, the display area A is divided by the second symmetry axis L2 into a left area AL and a right area AR, on opposite sides of the second axis of symmetry L2. In the second direction Y, the display area A is divided by the first symmetry axis L1 into an upper area AT and a lower area AB, on opposite sides of the first axis of symmetry L1. That is, the left area AL and the right area AR constitute the entire display area A. The upper area AT and the lower area AB constitute the entire display area A. The left area AL has areas overlapping with the upper area AT and the lower area AB, and the right area AR has areas overlapping with the upper area AT and the lower area AB. In one embodiment, the second direction Y is perpendicular to the first direction X.

As shown in FIG. 2, the array substrate 10 includes a substrate 11, scan lines 12 on the substrate 11, and data lines 14 on the substrate 11.

As shown in FIG. 2, the scan lines 12 include a plurality of first scan lines 122. The first scan lines 122 cross the routing area B2 and are spaced apart from each other in the second direction Y. Some of the first scan lines 122 cross the upper area AT and the routing area B2, and other first scan lines 122 cross the lower area AB and the routing area B2. The first scan lines 122 are axially symmetrical with respect to the first symmetry axis L1.

A portion of each first scan line 122 in the routing area B2 is axially symmetric with respect to the second symmetry axis L2. Each first scan line 122 extends in the first direction X to the routing area B2 in the left area AL, bends around the peripheral contour of the transparent area B1 in the routing area B2, and extends in the first direction X in the right area AR. That is, each first scan line 122 bypasses the transparent area B1, crosses the routing area B2, and extends in the first direction X in the display area A. The first scan lines 122 in the upper area AT and the routing area B2 bend and extend along the upper half of the transparent area B1. The first scan lines 122 in the lower area AB and the routing area B2 bend and extend along the lower half of the transparent area B1.

Each first scan line 122 includes at least two straight portions and a curved portion. One straight portion of each first scan line 122 extends in the first direction X in the left area AL. The curved portion of each first scan line 122 extends around the peripheral contour of the transparent area B1 in the routing area B2 (this is an arc in FIG. 2). The other straight portion of each first scan line 122 extends in the first direction X in the right area AR. A length of the curved portion of each first scan line 122 varies with a distance of the first scan line 122 from the first symmetry axis L1. The closer the first scan line 122 is to the first symmetry axis L1, the longer the length of the curved portion is. The further the first scan line 122 is from the first symmetry axis L1, the shorter the length of the curved portion is. In one embodiment, the first scan lines 122 are equally spaced apart from each other.

As shown in FIG. 2, the data lines 14 include first data lines 142 extending across the routing area B2. The first data lines 142 are spaced apart from each other in the first direction X. Some of the first data lines 142 extend in the left area AL and the routing area B2, and other first data lines 142 extend in the right area AR and the routing area B2. The first data lines 142 are axially symmetrical with respect to the second symmetry axis L2.

A portion of each first data line 142 in the routing area B2 is axially symmetric with respect to the first symmetry axis L1. Each first data line 142 extends in the second direction Y to the routing area B2 in the upper area AT, bends around the peripheral contour of the transparent area B1 in the routing area B2, and extends in the second direction Y in the lower area AB. That is, each first data line 142 bypasses the transparent area B1, crosses the routing area B2, and extends along the second direction Y in the display area A. The first data lines 142 in the left area AL and the routing area B2 bend and extend along the left half of the transparent area B1. The first data lines 142 in the right area AR and the routing area B2 bend and extend along the right half of the transparent area B1.

Each first data line 142 includes at least two straight portions and a curved portion. One straight portion of each first data line 142 extends in the second direction Y in the upper area AT. The curved portion of each first data line 142 extends around the peripheral contour of the transparent area B1 in the routing area B2 (this is an arc in FIG. 2). The other straight portion of each first data line 142 extends in the second direction Y in the lower area AB. A length of the curved portion of each first data line 142 varies with a distance of the first data line 142 from the second symmetry axis L2. The closer the first data line 142 is to the second symmetry axis L2, the longer the length of the curved portion is. The further the first data line 142 is from the second symmetry axis L2, the shorter the length of the curved portion is. In one embodiment, the first data lines 142 are equally spaced apart from each other. As shown in FIG. 2, the data lines 14 further include second data lines 144. The second data lines 144 extend across the routing area B2. Some of the second data lines 144 extend in the left area AL and the routing area B2, and other second data lines 144 extend in the right area AR and the routing area B2. The second data lines 144 are axially symmetrical with respect to the second symmetry axis L2. The first data lines 142 and the second data lines 144 are alternately arranged along the first direction X. In the first direction X, each second data line 144 alternates with one first data line 142.

Each second data line 144 extends in the second direction Y to the routing area B2 in the upper area AT, bends around the peripheral contour of the transparent area B1 in the routing area B2, and extends in the second direction Y in the lower area AB. That is, each second data line 144 bypasses the transparent area B1, crosses the routing area B2, and extends along the second direction Y in the display area A. The second data lines 144 in the left area AL and the routing area B2 bend and extend along the left half of the transparent area B1. The second data lines 144 in the right area AR and the routing area B2 bend and extend along the right half of the transparent area B1.

Each second data line 144 includes at least two straight portions and a curved portion. One straight portion of each second data line 144 extends along the second direction Y in the upper area AT. The curved portion of each second data line 144 extends around the peripheral contour of the transparent area B1 in the routing area B2 (this is an arc in FIG. 2). The other straight portion of each second data line 144 extends along the second direction Y in the lower area AB.

The curved portion of each second data line 144 is defined as an auxiliary data line 144a. Each auxiliary data line 144a is axially symmetric with respect to the first symmetry axis L1. Each first data line 142 is between two adjacent auxiliary data lines 144a, and one auxiliary data line 144a is arranged between two adjacent first data lines 142. The auxiliary data lines 144a and the curved portions of the first data lines 142 are alternately arranged in the first direction X. Each auxiliary data line 144a alternates with one first data line 142 in the first direction X. A length of the auxiliary data line 144a varies with a distance of the auxiliary data line 144a from the second symmetry axis L2. The closer the auxiliary data line 144a is to the second symmetry axis L2, the longer the length of the auxiliary data line 144a is. The further the auxiliary data line 144a is from the second symmetry axis L2, the shorter the length of the auxiliary data line 144a is.

The straight portion of each second data line 144 is defined as a data line lead 144b. The data line leads 144b and the straight portions of the first data lines 142 are alternately arranged in the first direction X. In the second direction Y, the first scan lines 122 are on a side of the auxiliary data lines 144a away from the transparent area B1. A projection of each data line lead 144b along a normal direction of the substrate 11 on the substrate 11 overlaps all of the first scan lines 122.

Figure 3:
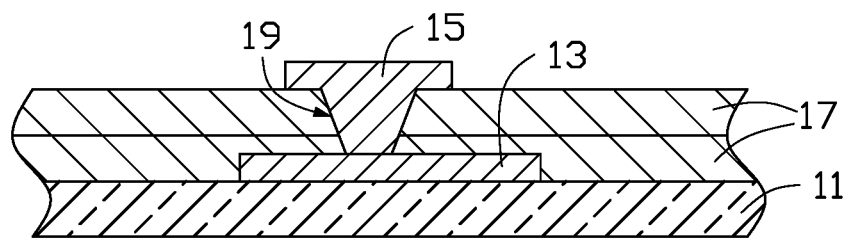
FIG. 3 is a cross-sectional view of the array substrate showing an auxiliary data line and a data line lead of FIG. 2 at a connection position.

As FIG. 3 shows, the array substrate 10 includes the substrate 11, a first conductive layer 13, a second conductive layer 15, and an insulating layer 17. The first conductive layer 13 is on a surface of the substrate 11. The insulating layer 17 is on the first conductive layer 13 between the first conductive layer 13 and the second conductive layer 15. The second conductive layer 15 is on the insulating layer 17. The insulating layer 17 is electrically insulating and may be made of a silicon oxide (SiOx) layer, a silicon nitride (SiNx) layer, or multiple layers including the silicon oxide (SiOx) layer and the silicon nitride (SiNx) layer.

The first scan lines 122 and the auxiliary data lines 144a are defined by the first conductive layer 13. The first data lines 142 and the data line leads 144b are defined by the second conductive layer 15. The second conductive layer 15 is electrically insulated and spaced apart from the first conductive layer 13. Each auxiliary data line 144a is electrically connected to one data line lead 144b by a via 19.

That is, the auxiliary data lines 144a and the first data lines 142 are in different conductive layers.

A projection of each first data line 142 along a normal direction of the substrate 11 on the substrate 11 is between two adjacent auxiliary data lines 144a, and the two adjacent first data lines 142 have one auxiliary data line 144a therebetween. Unlike the adjacent wires (e.g., the first and the second data lines) which are in the same conductive layers, the adjacent wires in the routing area B2 (e.g., the first data lines 142 and the auxiliary data lines 144a) in the present disclosure are in different conductive layer. This allows a denser arrangement of wires without risk of short circuit, which is advantageous for reducing an area of the routing area B2.

As FIG. 2 shows, the data lines 14 further include third data lines 146. The third data lines 146 extend across the routing area B2 and are on a side of the first data line 142 and the second data line 144 away from the transparent area B1. The third data lines 146 are sequentially spaced apart in the first direction X. Some of the third data lines 146 extend in the left area AL and the routing area B2, and others extend in the right area AR and the routing area B2. The third data lines 146 are axially symmetrical with respect to the second symmetry axis L2.

A portion of each third data line 146 in the routing area B2 is axially symmetric with respect to the first symmetry axis L1. Each third data line 146 extends along the second direction Y to the routing area B2 in the upper area AT, bends around the peripheral contour of the transparent area B1 in the routing area B2, and extends along the second direction Y in the lower area AB. That is, each third data line 146 bypasses the transparent area B1, crosses the routing area B2, and extends along the second direction Y in the display area A. The third data lines 146 in the left area AL and the routing area B2 bend and extend along the left half of the transparent area B1. The third data lines 146 in the right area AR and the routing area B2 bend and extend along the right half of the transparent area B1.

Each third data line 146 includes at least two straight portions and a curved portion. One straight portion of each third data line 146 extends in the second direction Y in the upper area AT. The curved portion of each third data line 146 extends around the peripheral contour of the transparent area B1 in the routing area B2 (this is an arc in FIG. 2). The other straight portion of each third data line 146 extends in the second direction Y in the lower area AB. A length of the curved portion of each third data line 146 varies with a distance of the third data line 146 from the second symmetry axis L2. The closer the third data line 146 is to the second symmetry axis L2, the longer the length of the curved portion is. The further the third data line 146 is from the second symmetry axis L2, the shorter the length of the curved portion is. In one embodiment, the third data lines 146 are equally spaced apart from each other.

In FIG. 2, the data lines 14 extending across the routing area B2 include the first, the second, and the third data lines 142, 144, and 146. In the first direction X, the data lines 14 in the routing area B2 are arranged such that the second and third data lines 144 and 146 (near the left area AL) alternate with the first and third data lines 142 and 146 (near the right area AR). The data lines 14 closest to the transparent area B1 may be the first data lines 142 or the second data lines 144.

In one embodiment, the third data lines 146 are defined by the second conductive layer 15. That is, the first data lines 142, the data line leads 144b of the second data lines 144, and the third data lines 146 are defined in the same conductive layer. The auxiliary data lines 144a of the second data lines 144 are formed by the first conductive layer 13. In one embodiment, the second data lines 144 are adjacent to the third data lines 146. In the data lines 14 extending across the routing area B2, adjacent data lines 14 of different types are in different conductive layers, so that the wires can be denser without causing short circuits, and difference between the inner and outer diameters of the routing area B2 is further reduced.

Referring to FIG. 2, the data lines 14 further include fourth data lines 148. The fourth data lines 148 extend only within the display area A and do not extend to the routing area B2. Some of the fourth data lines 148 are in the left area AL, and others are in the right area AR. In the left area AL, the fourth data lines 148 are spaced apart from each other, and each fourth data line 148 extends along the second direction Y. In the right area AR, the fourth data lines 148 are spaced apart from each other, and each fourth data line 148 extends along the second direction Y. In the lower area AB (or in the upper area AT), along the first direction X, the arrangement of the first, second, third, and fourth data lines 142, 144, 146, and 148 is such that the first, third, and fourth data lines 142, 146, and 148 alternate with the second, third, and fourth data lines 144, 146, and 148.

Referring to FIG. 2, the scan lines 12 further include second scan lines 124 only in the display area A. The second scan lines 124 extend only in the display area A, and do not extend to the routing area B2. Some of the second scan lines 124 are in the upper area AT, other second scan lines 124 are in the lower area AB. In the upper area AT, the second scan lines 124 are spaced apart from each other, and each second scan line 124 extends along the first direction X. In the lower area AB, the second scan lines 124 are spaced apart from each other, and each second scan line 124 extends along the first direction X. In the second direction Y, the first and the second scan lines 122 and 124 are arranged so that the second scan lines 124 are in the upper area AT, the first scan lines 122 are in the upper area AT, the first scan lines 122 are in the lower area AB, and the second scan lines 124 are in the lower area AB.

In one embodiment, the auxiliary data lines 144a and the second scan lines 124 are defined by the first conductive layer 13. The first, the second, the third, and the fourth data lines 142, 144, 146, and 148 are defined by the second conductive layer 15. That is, the first conductive layer 13 defines the auxiliary data lines 144a, and the first and the second scan lines 122 and 124. The second conductive layer 15 defines the first, the third, and the fourth data lines 142, 146, and 148, and the data line leads 144b. That is, all of the scan lines 12 (the first and the second scan lines 122 and 124) are formed in the first conductive layer 13. The data lines 14 (the first, the second, the third, and the fourth data lines 142, 144, 146, and 148), but not the auxiliary data lines 144a, are formed in the second conductive layer 15.

Since different wires (e.g., the first data lines 142 and the auxiliary data lines 144a, the third data lines 146 and the auxiliary data lines 144a) are formed in different conductive layers, adjacent wires can thus be arranged more densely without short circuits, which is advantageous for narrowing the design of the routing area B2. In addition, the auxiliary data lines 144a are closer than the first scan lines 122 to the transparent area B1 using the same conductive layer, and do not affect the wiring of the first scan lines 122.

Referring again to FIG. 2, none of the scan lines 12 and data lines 14 trespass in the camera area B, allowing light to pass through the camera area B without obstruction. A portion of each first scan line 122, a portion of each first data line 142, a portion of each second data line 144, and a portion of each third data line 146 form a ring shape surrounding the transparent area B1. All the scan lines 12 (the first and the second scan line 122 and 124) extend in the first direction X in the display area A, and all the data lines 14 (the first, the second, the third, and the fourth data lines 142, 144, 146, and 148) in the display area A extend in the second direction Y. The projection of each first data line 142, each second data line 144, each third data line 146, and each fourth data line 148 along a normal direction of the substrate 11 on the substrate 11 overlaps with all of the first and second scan lines 122 and 124.

In one embodiment, images are not displayed in the camera area B. Any two adjacent first and second scan lines 122 and 124 and any two adjacent lines of the first, second, third, and fourth data lines 142, 144, 146, and 148 intersect in the display area A and thereby define one sub-pixel 16 (as shown in FIG. 4).

Figure 4:
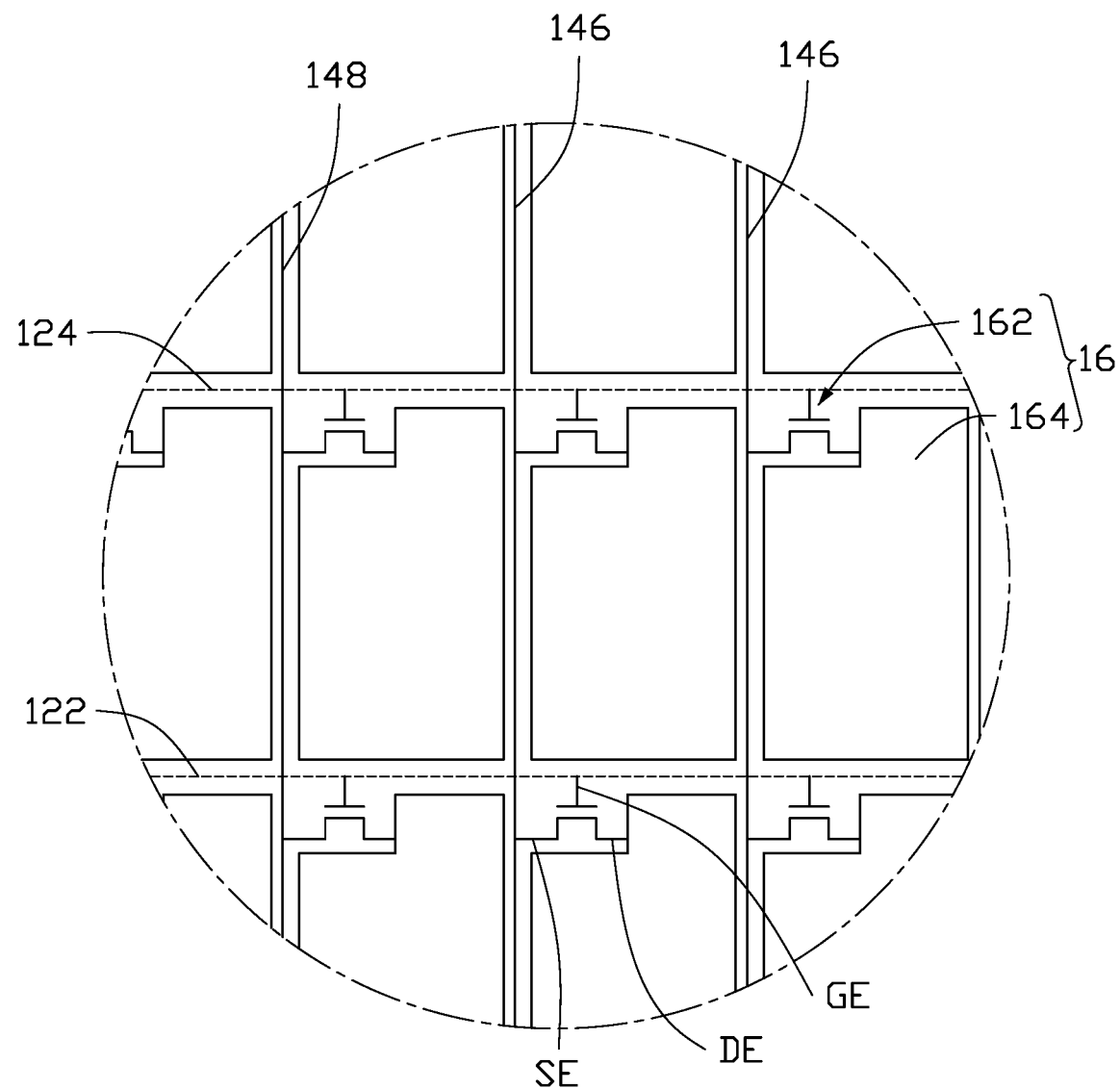
FIG. 4 is an enlarged view of circled area IV of FIG. 2.

As shown in FIG. 4, a thin film transistor 162 and a pixel electrode 164 are located in each sub-pixel 16. The thin film transistor 162 includes a gate electrode GE, a source electrode SE, and a drain electrode DE. The gate electrode GE is electrically connected to one of the first and second scan lines 122 and 124. The source electrode SE is electrically connected to one of the first, second, third, and fourth data lines 142, 144, 146, and 148. The drain electrode DE is electrically connected to the pixel electrode 164 in one sub-pixel 16.

It can be understood that although the arrangement of scan lines 12 and data lines 14 on the array substrate 10 is exemplarily described in this disclosure, in other embodiments, there can be an arrangement of other wires (e.g., touch wires) on the array substrate 10 defining the camera area B.

In one embodiment, the substrate 11 is made of a transparent hard material, such as glass, quartz, or plastic. In other embodiments, the substrate 11 may be made of a flexible material, such as one or more of polyethersulfone (PES), polyethylene naphthalate (PEN), polyethylene (PE), polyimide (PI), polyvinyl chloride (PVC), and polyethylene terephthalate (PET). The first and the second conductive layers 13 and 15 are made of at least one material selected from a group consisting of aluminum, silver, gold, chromium, copper, indium, manganese, molybdenum, nickel, neodymium, palladium, platinum, titanium, tungsten, and zinc. The insulating layer 17 may be made of silicon oxide (SiOx), silicon nitride (SiNx), and/or silicon oxynitride (SiOxNy).

Figure 5:
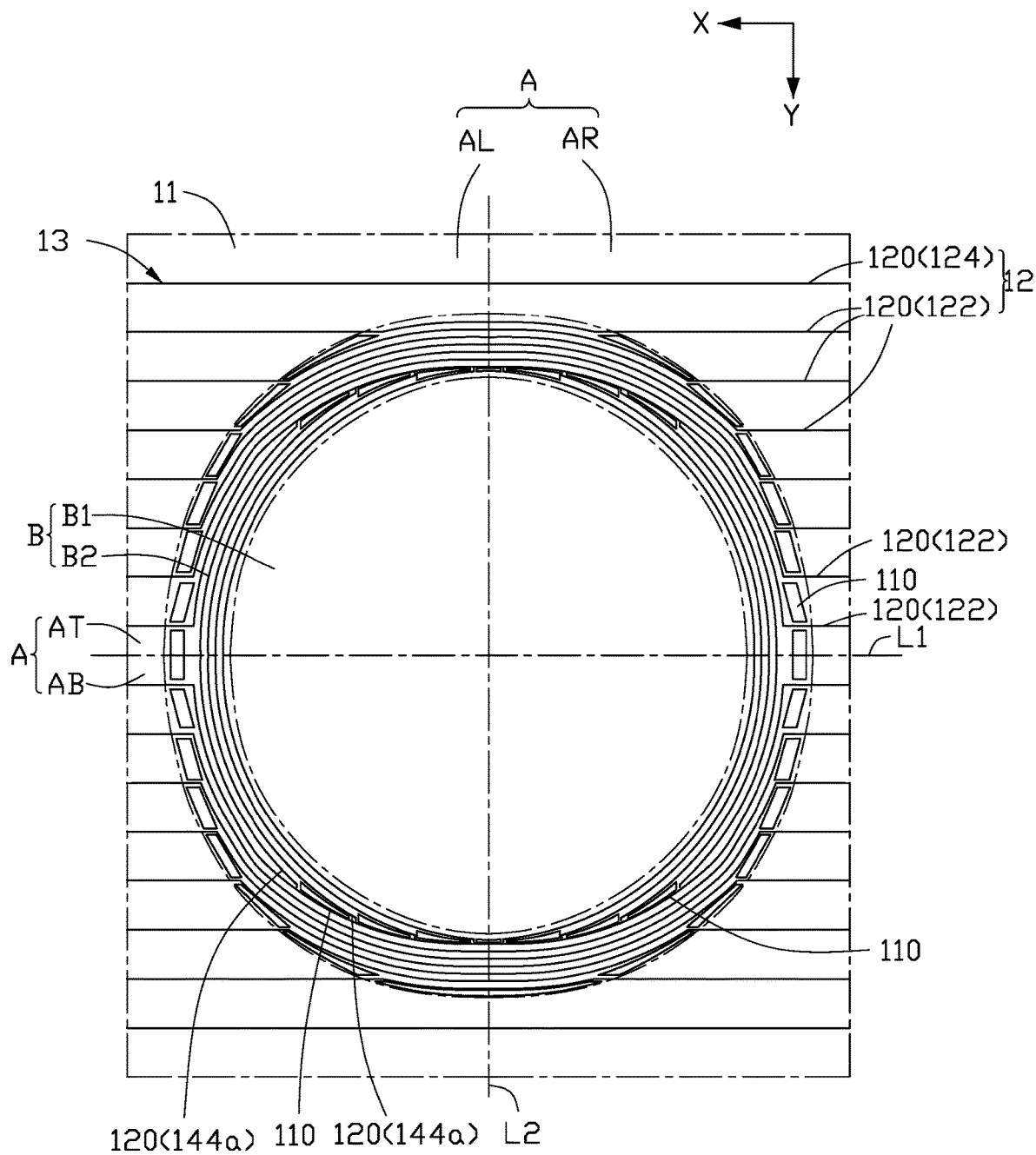
FIG. 5 is a schematic view showing a projection of a first conductive layer on a base layer of FIG. 2.

As shown in FIG. 5, the first conductive layer 13 further includes first capacitance compensation patterns 110 which are electrically insulated and spaced from first wires 120. Each first capacitance compensation pattern 110 is between two adjacent first wires 120. Some of the first capacitance compensation patterns 110 are between two adjacent first scan lines 122 and in the routing area B2 close to the display area A. Some of the first capacitance compensation patterns 110 are between two adjacent auxiliary data lines 144a and in the routing area B2 close to the transparent area B1. In FIG. 5, a shape of the first capacitance compensation pattern 110 is substantially a hollow rectangle. In other embodiments, the first capacitance compensation pattern 110 may have other shapes.

Figure 6:
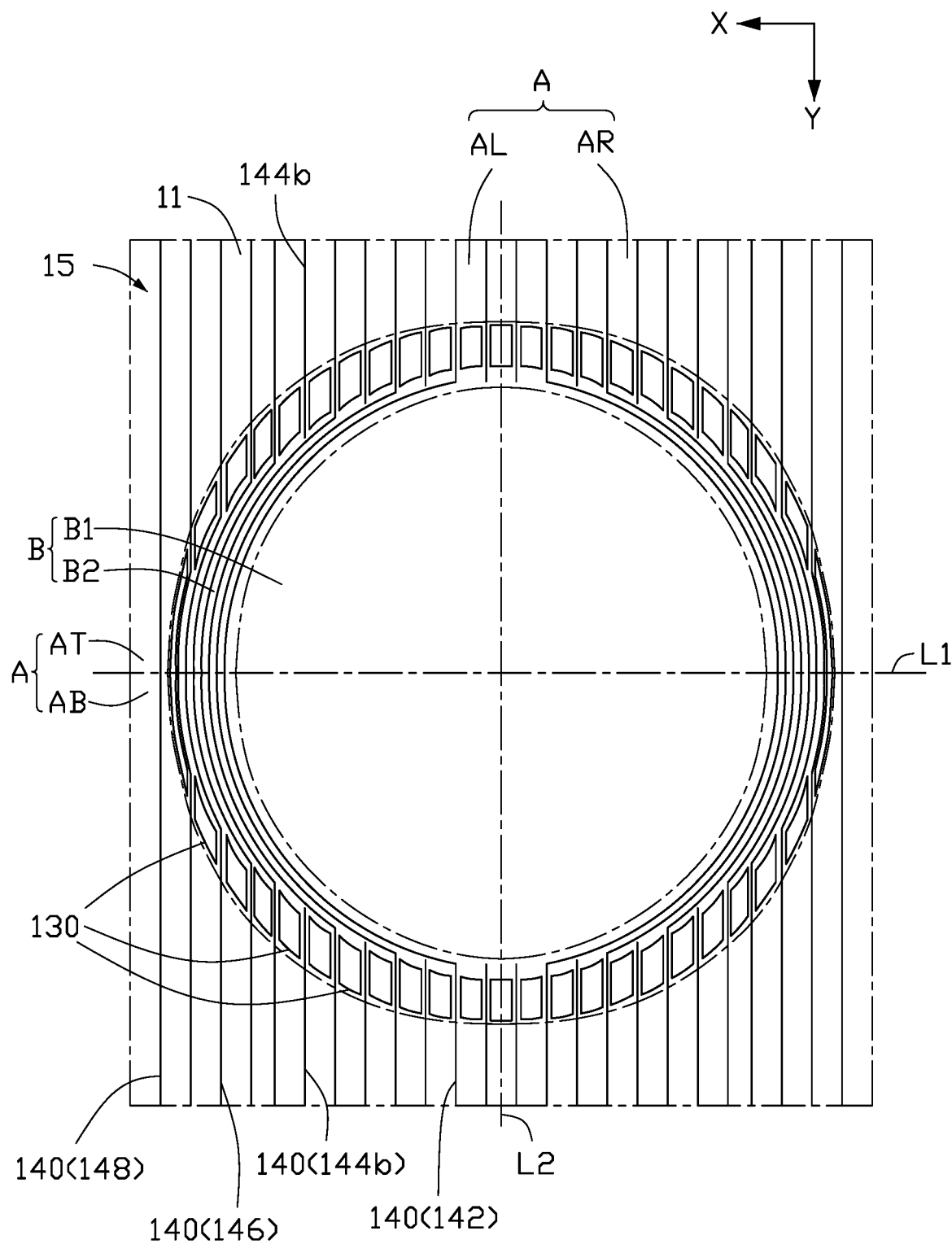
FIG. 6 is a schematic view showing a projection of a second conductive layer on the base layer of FIG. 2.

As shown in FIG. 6, the second conductive layer 15 further includes second capacitance compensation patterns 130 which are electrically insulated and spaced from the second wires 140. Each second capacitance compensation pattern 130 is between two adjacent second wires 140. One or more second capacitance compensation patterns 130 can be set between any two adjacent data lines 142, 144, 146, and 148 in alignment routing area B2. The second capacitance compensation patterns 130 are on a side of the routing area B2 close to the display area A.

In FIG. 6, a shape of the second capacitance compensation pattern 130 is substantially a hollow rectangle. In other embodiments, the second capacitance compensation pattern 130 may have other shapes. Some of the two adjacent second wires 140 have the second capacitance compensation pattern 130, while some of the two adjacent second wires 140 do not have the second capacitance compensation pattern 130.

Figure 7:
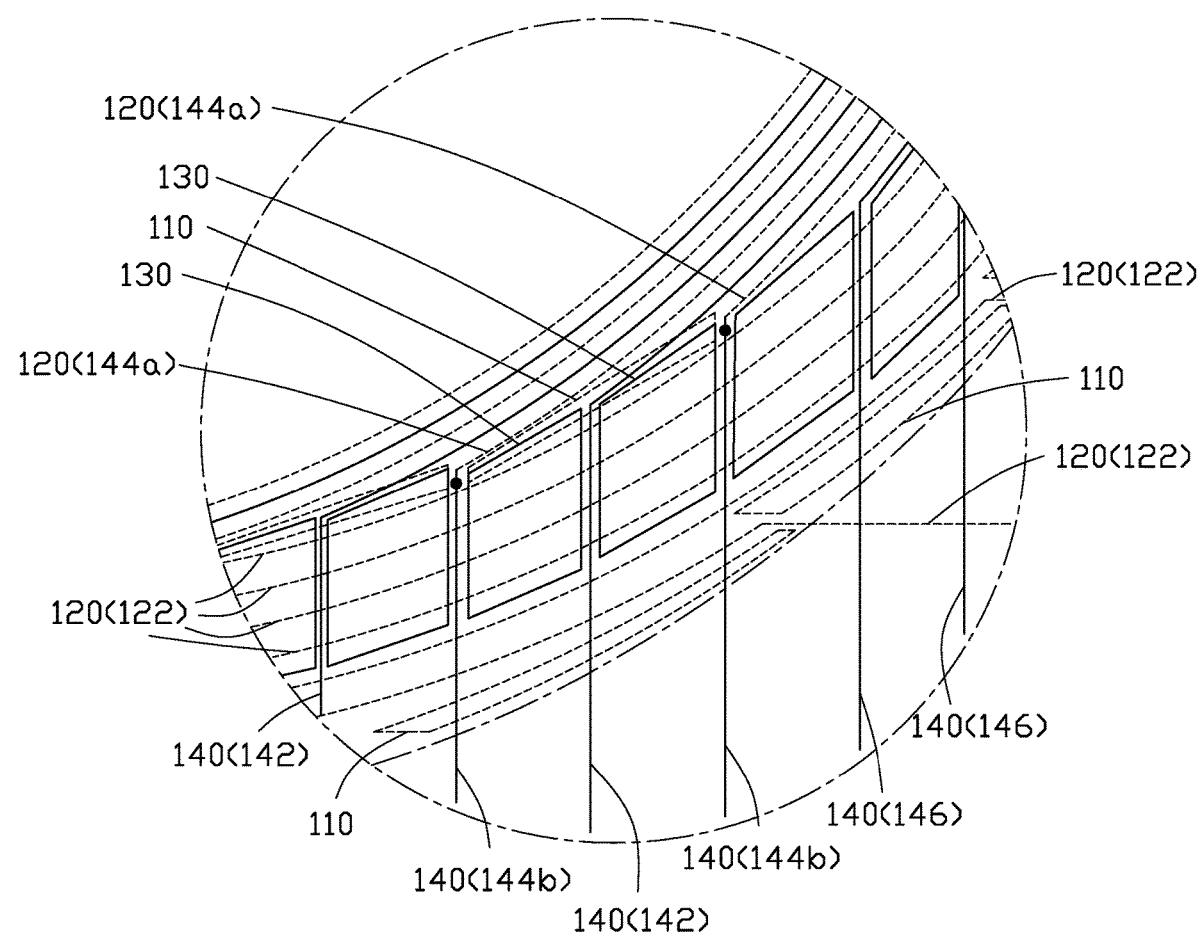
FIG. 7 is an enlarged view of circled area VII of FIG. 2.

As shown in FIG. 7, along a thickness direction of the array substrate 10, the projection of each first capacitance compensation pattern 110 on the substrate 11 overlaps with the projection of at least one second wire 140 for signal compensation between adjacent first wires 120. Along the thickness direction of the array substrate 10, the projection of each second capacitance compensation pattern 130 on the substrate 11 overlaps with the projection of at least one first wire 120, so as to realize signal compensation between adjacent second wires 140.

Figure 8:
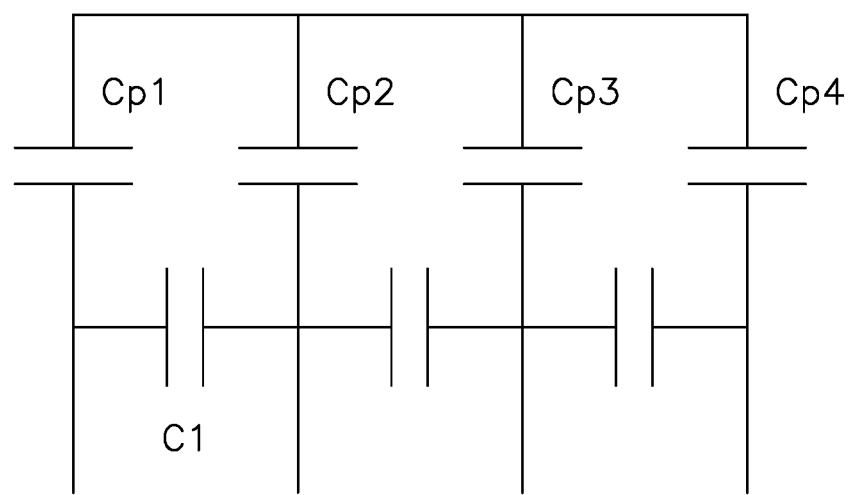
FIG. 8 is an equivalent circuit diagram showing a second compensation capacitance pattern overlapping with four first wires according to an embodiment.

As shown in FIG. 8, the parasitic capacitance between adjacent first wires 120 is C1, the original capacitance of the first wire 120 is Cs, and the amount of capacitance coupling increased by the four first wires 120, due to the setting of the second capacitance compensation patterns 130, is Cp1, Cp2, Cp3, and Cp4. The coupling voltage Vc1 of the first wire 120 is:

$$Vc1 = dV^*(C1 + Cp1^*Cp2/(Cp1+Cp2))/(C1 + Cs + Cp1(Cp2+Cp3+Cp4)/(Cp1+Cp2+Cp3+Cp4)).$$

If the array substrate 10 is not provided with the second capacitance compensation patterns 130, the coupling voltage Vc2 of the first wire 120 is:

$$Vc2 = dV^*C1/(C1+Cs).$$

It can be seen that when the projections of the first wire 120 and the second capacitance compensation pattern 130 overlap, the coupling voltage Vc1 is less than the coupling voltage Vc2 when the second capacitance compensation pattern 130 is not provided. When the coupling voltage of the first wire 120 decreases, the influence of the coupling voltage on the original voltage of the first wire 120 is weakened, thereby reducing parasitic capacitance between adjacent wires (the first and second wires 120 and 140) on the array substrate 10.

It can be known from the above formula that the influence of the second capacitance compensation pattern 130 on the original voltage of the first wire 120 has a relationship with the number of the first wires 120. In an embodiment, the projection of each second capacitance compensation pattern 130 on the substrate 11 overlaps with the projections of at least three first wires 120 to better reduce the parasitic capacitance on the original voltage of the first wires 120. The capacitance compensation principle for the first capacitance compensation patterns 110 and the second wires 140 is similar to this, and is not repeated here. Similarly, in an embodiment, the projection of each first capacitance compensation pattern 110 on the substrate 11 overlaps with the projections of at least three second wires 140 to better reduce the effect of parasitic capacitance on the original voltage on the second wires 140, thereby reducing parasitic capacitance between adjacent lines (the first and second wires 120 and 140) in view of the tight alignment on the array substrate 10, which affects the display effect.

Figure 9:
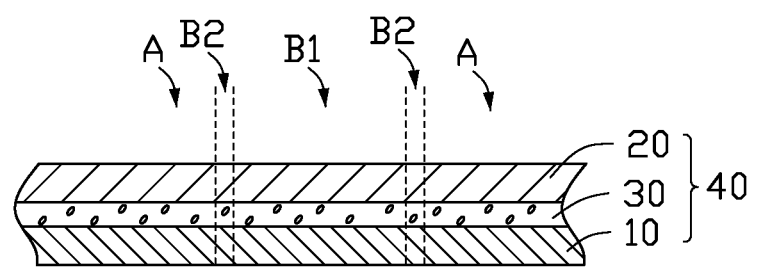
FIG. 9 is a cross-sectional view of a display panel according to an embodiment.

FIG. 9 shows a display panel 40 according to an embodiment. As shown in FIG. 9, the display panel 40 includes the array substrate 10, a color filter substrate 20 opposite to the array substrate 10, and a liquid crystal layer 30 between the array substrate 10 and the color filter substrate 20.

The color filter substrate 20 includes a transparent substrate (not shown), a black matrix (not shown) on a side of the transparent substrate close to the liquid crystal layer 30, a filter layer (not shown), and a protective layer (not shown). The black matrix, the filter layer, and the protective layer are not present in the transparent area B1 of the camera area B. The liquid crystal layer 30 is in the display area A and the camera area B.

The array substrate 10 further includes a common electrode (not shown) in the display area A. The pixel electrodes 164 and the common electrode generate an electric field to rotate liquid crystal molecules in the liquid crystal layer 30 for displaying images. The camera area B does not display images.

Figure 10:
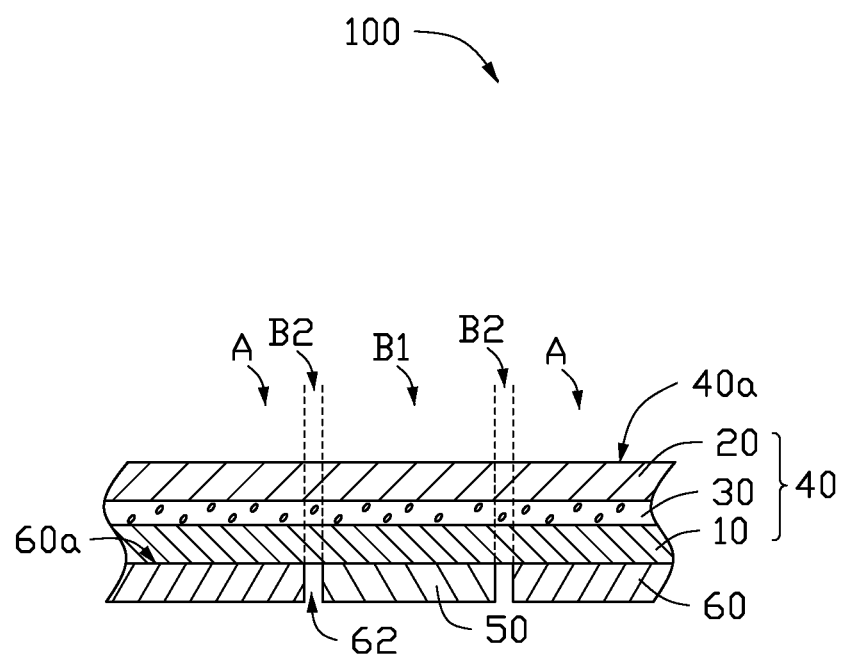
FIG. 10 is a cross-sectional view of a display device according to an embodiment.

FIG. 10 shows a display device 100 according to an embodiment. As shown in FIG. 10, the display device 100 includes the display panel 40, a backlight module 60, and a camera 50. The display panel 40 has a display surface 40a. The backlight module 60 and the camera 50 are on a side of the display panel 40 away from the display surface 40a. The backlight module 60 defines a light exiting side 60a from which light can exit. The display panel 40 is on the light exiting side 60a of the backlight module 60. The camera 50 is in the camera area B to collect light through the camera area B.

The backlight module 60 is a direct type backlight. The backlight module 60 includes a light source (not shown), an optical film group (not shown), a back plate (not shown), and the like. The backlight module 60 defines a mounting hole 62 through the backlight module 60 in the camera area B. A size of the mounting hole 62 is greater than or substantially equal to a size of the camera area B. The camera 50 is in the mounting hole 62. As the camera 50 is arranged in the camera area B, surrounded by the display area A, there is no need to open a through hole for the camera 50 in border area of the display panel 40. The border of the display device 100 can therefore be narrow or even non-existent, thereby increasing a screen-to-body ratio of the display device 100. In one embodiment, the display device 100 may be a mobile phone, a tablet computer, or the like.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. An array substrate defining a display area and a camera area surrounded by the display area, the camera area defining a transparent area and a routing area surrounding the transparent area, the array substrate comprising:
    a substrate;
    a first conductive layer on the substrate, the first conductive layer comprising a plurality of first wires around the transparent area;
    an insulating layer on the first conductive layer, the insulating layer being electrically insulative;
    a second conductive layer on the insulating layer, the second conductive layer comprising a plurality of second wires around the transparent area;
    wherein the first conductive layer further comprises a plurality of first capacitance compensation patterns electrically insulated and spaced from the plurality of first wires;
    each of the plurality of first capacitance compensation patterns is between adjacent first wires; and
    a projection of each of the plurality of first capacitance compensation patterns on the substrate overlaps with a projection of at least one of the plurality of second wires along a thickness direction of the array substrate;
    wherein the second conductive layer further comprises a plurality of second capacitance compensation patterns electrically insulated and spaced from the plurality of second wires;
    each of the plurality of second capacitance compensation patterns is between adjacent second wires; and
    a projection of each of the plurality of second capacitance compensation patterns on the substrate overlaps with a projection of at least one of the plurality of first wires along the thickness direction of the array substrate.

2. The array substrate according to claim 1, wherein the plurality of first wires comprises a plurality of first scan lines;
    each of the plurality of first scan lines bypasses the transparent area, crosses the routing area, and extends in a first direction in the display area; and
    at least one of the plurality of first capacitance compensation patterns is arranged between adjacent first scan lines.

3. The array substrate according to claim 2, wherein the plurality of second wires comprises a plurality of first data lines;
    each of the plurality of first data lines bypasses the transparent area, crosses the routing area, and extends in a second direction in the display area;
    the second direction intersects with the first direction; and
    at least one of the plurality of second capacitance compensation patterns is between adjacent first data lines.

4. The array substrate according to claim 3, further comprising a plurality of second data lines, wherein each of the plurality of second data lines bypasses the transparent area, crosses the routing area, and extends in the second direction in the display area;
    each of the plurality of second data lines is alternatively arranged with one of the plurality of first data lines in the first direction;
    the plurality of first wires further comprises a plurality of auxiliary data lines in the routing area;
    the plurality of second wires further comprises a plurality of data line leads extending in the second direction in the routing area and the display area;
    each of the plurality of auxiliary data lines is electrically coupled to one of the plurality of data line leads; and
    each of the plurality of second data lines comprises one of the plurality of auxiliary data lines and one of the plurality of data line leads.

5. The array substrate according to claim 4, wherein at least one of the plurality of first capacitance compensation patterns is between adjacent auxiliary data lines.

6. The array substrate according to claim 5, wherein at least one of the plurality of second capacitance compensation patterns is between a pair of one of the plurality of first data lines and one of the plurality of second data lines adjacent to each other.

7. The array substrate according to claim 6, wherein the plurality of second wires further comprises a plurality of third data lines;

each of the plurality of third data lines bypasses the transparent area, crosses the routing area, and extends in the second direction in the display area;

in the first direction, the plurality of third data lines is on a side of the plurality of first data lines and the plurality of second data lines away from the transparent area; and at least one of the plurality of second capacitance compensation patterns is between adjacent third data lines.

8. A display panel, comprising:
a color filter substrate;
an array substrate; and
a liquid crystal layer between the color filter substrate and the array substrate, the array substrate defining a display area and a camera area surrounded by the display area, the camera area defining a transparent area and a routing area surrounding the transparent area, the array substrate comprising:
a substrate;
a first conductive layer on the substrate, the first conductive layer comprising a plurality of first wires around the transparent area;
an insulating layer on the first conductive layer, the insulating layer being electrically insulative;
a second conductive layer on the insulating layer, the second conductive layer comprising a plurality of second wires around the transparent area;
wherein the first conductive layer further comprises a plurality of first capacitance compensation patterns electrically insulated and spaced from the plurality of first wires; each of the plurality of first capacitance compensation patterns is between adjacent first wires; and a projection of each of the plurality of first capacitance compensation patterns on the substrate overlaps with a projection of at least one of the plurality of second wires along a thickness direction of the array substrate;
wherein the second conductive layer further comprises a plurality of second capacitance compensation patterns electrically insulated and spaced from the plurality of second wires;
each of the plurality of second capacitance compensation patterns is between adjacent second wires; and
a projection of each of the plurality of second capacitance compensation patterns on the substrate overlaps with a projection of at least one of the plurality of first wires along the thickness direction of the array substrate.

9. The display panel according to claim 8, wherein the plurality of first wires comprises a plurality of first scan lines;
each of the plurality of first scan lines bypasses the transparent area, crosses the routing area, and extends in a first direction in the display area; and
at least one of the plurality of first capacitance compensation patterns is arranged between adjacent first scan lines.

10. The display panel according to claim 9, wherein the plurality of second wires comprises a plurality of first data lines;
each of the plurality of first data lines bypasses the transparent area, crosses the routing area, and extends in a second direction in the display area;
the second direction intersects with the first direction; and
at least one of the plurality of second capacitance compensation patterns is between adjacent first data lines.

11. The display panel according to claim 10, further comprising a plurality of second data lines, wherein each of the plurality of second data lines bypasses the transparent area, crosses the routing area, and extends in the second direction in the display area;

each of the plurality of second data lines is alternatively arranged with one of the plurality of first data lines in the first direction;

the plurality of first wires further comprises a plurality of auxiliary data lines in the routing area;

the plurality of second wires further comprises a plurality of data line leads extending in the second direction in the routing area and the display area;

each of the plurality of auxiliary data lines is electrically coupled to one of the plurality of data line leads; and each of the plurality of second data lines comprises one of the plurality of auxiliary data lines and one of the plurality of data line leads.

12. The display panel according to claim 11, wherein at least one of the plurality of first capacitance compensation patterns is between adjacent auxiliary data lines.

13. The display panel according to claim 12, wherein at least one of the plurality of second capacitance compensation patterns is between a pair of one of the plurality of first data lines and one of the plurality of second data lines adjacent to each other.

14. The display panel according to claim 13, wherein the plurality of second wires further comprises a plurality of third data lines;
each of the plurality of third data lines bypasses the transparent area, crosses the routing area, and extends in the second direction in the display area;
in the first direction, the plurality of third data lines is on a side of the plurality of first data lines and the plurality of second data lines away from the transparent area; and
at least one of the plurality of second capacitance compensation patterns is between adjacent third data lines.

15. A display device, comprising:
a display panel; the display panel comprising a color filter substrate, an array substrate, and a liquid crystal layer between the color filter substrate and the array substrate, the array substrate defining a display area and a camera area surrounded by the display area, the camera area defining a transparent area and a routing area surrounding the transparent area, the display panel comprising a display surface for displaying images;
a backlight module on a side of the display panel facing away from the display surface, the backlight module defining a mounting hole extending through the backlight module, and the mounting hole being in the transparent area; and
a camera on the side of the display panel facing away from the display surface, the camera being in the mounting hole and collecting image information through the transparent area;
the array substrate comprising:
a substrate;
a first conductive layer on the substrate, the first conductive layer comprising a plurality of first wires around the transparent area;
an insulating layer on the first conductive layer, the insulating layer being electrically insulative;
a second conductive layer on the insulating layer, the second conductive layer comprising a plurality of second wires around the transparent area;
wherein the first conductive layer further comprises a plurality of first capacitance compensation patterns electrically insulated and spaced from the plurality of first wires; each of the plurality of first capacitance compensation patterns is between adjacent first wires; and a projection of each of the plurality of first capacitance compensation patterns on the substrate overlaps with a projection of at least one of the plurality of second wires along a thickness direction of the array substrate;

wherein the second conductive layer further comprises a plurality of second capacitance compensation patterns electrically insulated and spaced from the plurality of second wires;

each of the plurality of second capacitance compensation patterns is between adjacent second wires; and a projection of each of the plurality of second capacitance compensation patterns on the substrate overlaps with a projection of at least one of the plurality of first wires along the thickness direction of the array substrate.

16. The display device according to claim 15, wherein the plurality of first wires comprises a plurality of first scan lines;
- each of the plurality of first scan lines bypasses the transparent area, crosses the routing area, and extends in a first direction in the display area; and
- at least one of the plurality of first capacitance compensation patterns is arranged between adjacent first scan lines.

17. The display device according to claim 16, wherein the plurality of second wires comprises a plurality of first data lines;
- each of the plurality of first data lines bypasses the transparent area, crosses the routing area, and extends in a second direction in the display area;
- the second direction intersects with the first direction; and
- at least one of the plurality of second capacitance compensation patterns is between adjacent first data lines.

* * * * *